United States Patent [19]

Yarita et al.

[11] Patent Number: 5,049,244
[45] Date of Patent: * Sep. 17, 1991

[54] METHOD OF MANUFACTURING DOUBLE-SIDED WIRING SUBSTRATE

[75] Inventors: Yoshio Yarita, Mizuho; Yoshihiro Kawamura, Fussa, both of Japan

[73] Assignee: Casio Computer Co., Ltd., Tokyo, Japan

[*] Notice: The portion of the term of this patent subsequent to Oct. 23, 2007 has been disclaimed.

[21] Appl. No.: 464,412

[22] Filed: Jan. 12, 1990

[30] Foreign Application Priority Data

Jan. 20, 1989 [JP] Japan .................................. 1-11368
Mar. 1, 1989 [JP] Japan .................................. 1-48777

[51] Int. Cl.⁵ .............................................. C23C 26/00
[52] U.S. Cl. .................................. 204/15; 204/38.4; 204/192.14; 427/96; 427/98
[58] Field of Search ................. 427/96, 97; 204/15, 204/38.4, 192.14, 197.17

[56] References Cited

U.S. PATENT DOCUMENTS

| | | | |
|---|---|---|---|
| 3,625,758 | 12/1971 | Stahl | 427/98 |
| 3,854,973 | 12/1974 | Mersereau | 427/98 |
| 3,934,335 | 1/1976 | Nelson | 427/96 |
| 4,217,182 | 8/1980 | Cross | 427/98 |
| 4,554,732 | 11/1985 | Sadlo | 427/96 |
| 4,604,799 | 8/1986 | Gurol | 427/96 |
| 4,908,094 | 3/1990 | Jones | 427/96 |
| 4,964,947 | 10/1990 | Yarita | 427/97 |

FOREIGN PATENT DOCUMENTS

WO88/03443  5/1988  PCT Int'l Appl. ............ 427/96

Primary Examiner—Shrive Beck
Assistant Examiner—Vi Doung Dang
Attorney, Agent, or Firm—Frishauf, Holtz, Goodman & Woodward

[57] ABSTRACT

Disclosed is a method of manufacturing a double-sided wiring substrate wherein fine wiring patterns having a low resistivity are formed on both surfaces of a substrate. An insulating substrate having upper, lower, and side surfaces is prepared. The inner wall of a through hole formed in the insulating substrate or a side edge portion of the substrate is used as the side surface. A thin metal film is formed on the entire surface of the insulating substrate including its side surface by a deposition. The insulating film is covered with a resist film except for a wiring pattern region to be formed, and plating is performed. When the resist film is removed, the thin metal film is exposed outside the wiring patterns formed by the thick metal film. Etching is performed for a short period of time to remove a surface layer of the thick metal film and exposed region of the thin metal film.

17 Claims, 9 Drawing Sheets

METHOD OF MANUFACTURING DOUBLE-SIDED WIRING SUBSTRATE

BACKGROUND OF THE INVENTION

1. Field of the invention

The present invention relates to a method of manufacturing a double-sided wiring substrate and, more particularly, to a method of efficiently forming fine wiring patterns having a low resistance on both surfaces of a substrate.

2. Description of the Related Art

In a conventional double-sided wiring substrate having surfaces on both of which electric conductive patterns (hereinafter wiring patterns) are respectively formed, a through hole which extends from the upper surface to the lower surface of the substrate is formed by, e.g., punching or drilling, and a metal such as copper is plated on the inner wall of the through hole to connect the wiring patterns formed on both the surfaces. In such a method, however, a metal such as copper cannot be directly plated on the inner wall of the through hole, and hence a pretreatment or undercoating treatment must be performed in advance for the inner wall of the through hole. Therefore, the plating process is complicated, and manufacturing cost is undesirably increased.

Recently, the following method has been considered. That is, after a substrate is pierced with a metal pin to form a pin hole which extends from the upper surface to the lower surface, the pin hole is filled with an electric conductive paste to connect wiring patterns respectively formed on the upper and lower surfaces. The above technique is disclosed in Unexamined Japanese Patent Publication Nos. 60-208888 and 60-208894.

In the technique disclosed in the above applications, a carbon ink is used as an electric conductive paste. Since the carbon ink has a high electric resistivity, it cannot be applied to a low-resistance circuit. In addition, as is conventionally known, when a conductive patterns is formed with the carbon ink, it may often be stained or blurred to disable formation of fine wiring patterns.

SUMMARY OF THE INVENTION

It is, therefore, an object of the present invention to provide a method of manufacturing a double-sided wiring substrate which can form fine electrically conductive patterns having a low resistance, and allows efficient manufacture.

In order to achieve the above object, according to the present invention, there is provided a method of manufacturing a double-sided substrate comprising the steps of:

A method of manufacturing a double-sided wiring substrate comprising the steps of: preparing an insulating substrate having upper, lower, and side surfaces; forming a thin metal film on the upper, lower, and side surfaces of the insulating substrate by deposition; covering region of the upper and lower surfaces of the insulating substrate, except for wiring pattern formation region, with a resist layer; forming a thick metal film on the metal thin film formed in pattern formation region on the side, upper, and lower surfaces of the insulating substrate by plating; removing the resist layer; and removing the thin metal film formed on the region except for the pattern formation region using the thick metal film as a mask.

BRIEF DESCRIPTION OF THE DRAWINGS

FIGS. 2A, 1B, 1C, 1D, 1E, 1F, 2H are plan views respectively corresponding to FIGS. 1A, 1B, 1C, 1D, 1E, 1F, 1G, 1H;

DETAILED DESCRIPTION OF THE PREFERRED EMBODIMENTS

First Embodiment

A method of manufacturing the present invention will be described hereinafter with reference to FIGS. 1A to 1H, and FIGS. 2A to 2H.

Figure 1A:
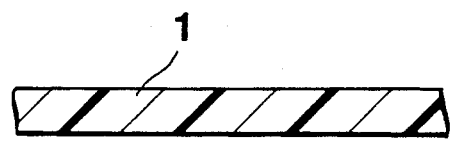
FIGS. 1A, 1B, 1C, 1E, 1F, 1G, 1H are enlarged sectional views of a main part of a wiring substrate in each manufacturing step, and show a method of manufacturing a double-sided wiring substrate according to the first embodiment of the present invention.
Figure 1B:
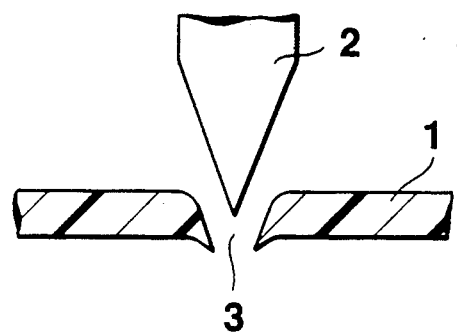
Figure 2A:
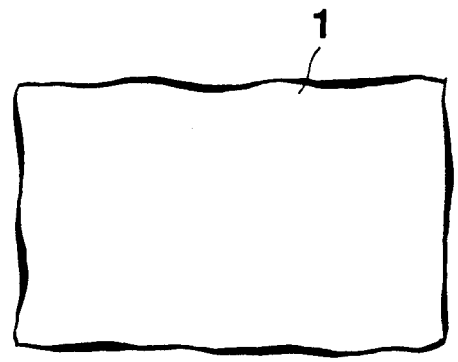
Figure 2B:
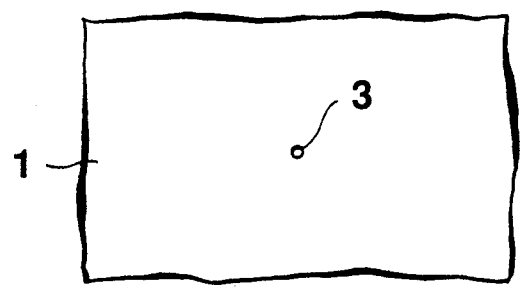

As shown in FIGS. 1A and 2A, an insulating film 1 is prepared. The insulating film 1 consists of a synthetic resin, e.g., polyimide, polyester, or epoxy glass. As shown in FIGS. 1B and 2B, the insulating film 1 is pierced from its upper surface with a metal pin 2 to form a pin hole 3 which extends from the upper surface to the lower surface at a predetermined portion of the insulating film 1. In this case, e.g., a cotton needle No. 5 (the diameter of a thickest portion: 0.84 mm) is used as the pin 2 to cause its sharp distal end to form a tapered hole having a mean hole diameter of 0.1 to 0.4 mm. Note that the pin hole 3 is formed by the pin 2 shown in FIG. 1B the insulating film 1 is directly pierced by the sharp distal end before a metal layer such as a copper layer is formed on the surface of the insulating film 1. Therefore, the distal end of the pin 2 is scarcely rounded.

Figure 1C:
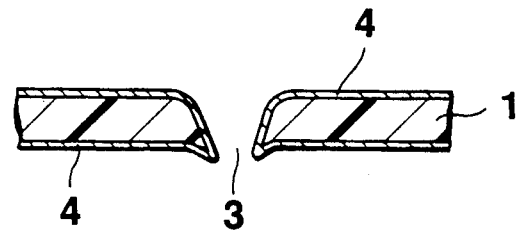
Figure 2C:
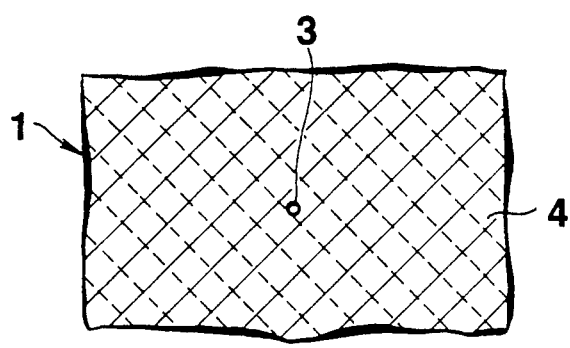

As shown in FIGS. 1C and 2C, a thin metal film 4 is formed on the upper and lower surfaces of the insulating film 1 and the inner wall of the pin hole 3 by vaccum deposition or sputtering. The thin metal film 4 consists of a metal such as copper (Cu) or aluminum (Al). The thickness of the thin metal film 4 is about several hundreds to several thousands Å. As described above, the pin hole 3 is tapered to be narrower toward its lower end. Therefore, when the thin metal film 4 is formed on the upper surface of the insulating film 1, metal particles are also adhered to the inner wall of the pin hole 3. Therefore, the thin metal film 4 is continuously formed to cover the upper and lower surfaces of the insulating film 1 through the pin hole 3. In practice, vaccum deposition or sputtering is performed twice, i.e., to the upper and lower surfaces of the insulating film 1, as a matter of course. The thin metal film 4 is then adhered to the inner wall of the pin hole 3 in the two operations, thus realizing further reliable adhesion.

Figure 1D:
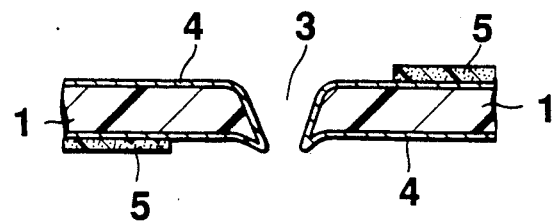
Figure 2D:
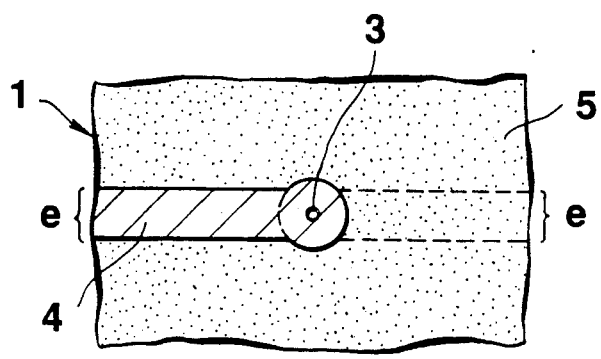

Thereafter, as shown in FIGS. 1D and 2D, an insulating layer 5 is formed on the entire regions of the upper and lower surfaces of the insulating film 1 except for wiring pattern formation regions e which include region in the vicinity of the pin hole 3 on both surfaces of the insulating film 1 by a screen printing or a photolithography. The insulating layer 5 consists of a hot melt resin or a resist such as a photoresist. In case the insulating layer 5 is formed by a screen printing, a resist is printed on the insulating film 1 through a screen. The insulating layer 5 is directly formed into patterns shown in FIG. 2D. In case the insulating layer 5 is formed by a photolithography, a photoresist is applied to the entire surface of the insulating film 1, and this photoresist is exposed and developed through a mask, thereby forming the insulating layer 5 into patterns shown in FIG. 2D.

Figure 1E:
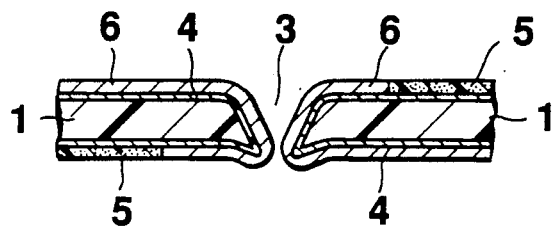
Figure 2E:
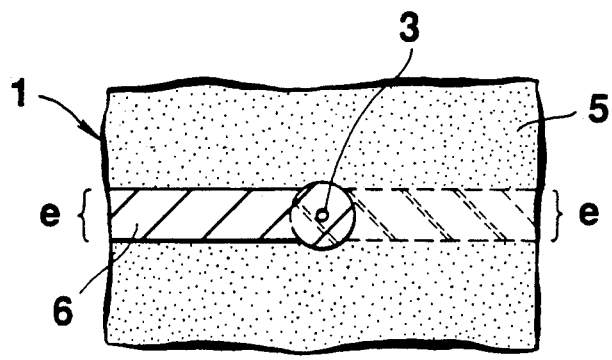

Subsequently, as shown in FIGS. 1E and 2E, a thick metal film 6 is formed on the entire surface of the thin metal film 4 by electroplating. The thick metal thick film 6 can be formed on only the surface of the thin metal film 4 by electroplating because the thin metal film 4 serves as an undercoating electroplating layer. However, the film 6 is not formed on the surface of the insulating layer 5. The material of the thick metal film 6 may be the same as or different from that of the above-mentioned thin metal film 4. The thick metal film finally has a thickness of about several to several tens $\mu$m. If the material of the thick metal film 6 is the same as that of the thin metal film 4, however, the film 6 is etched together with the thin metal film 4 in the following step, therefore, the thickness of the thick metal film 6 must be increased by the thickness of the thin metal film 4. Note that, in this case, since the pin hole 3 is tapered to be narrower toward its lower end, metal particles can be successfully deposited to the thin metal film 4 formed on the inner wall of the pin hole 3, thus forming the thick metal film 6. In particular, when the material of the thick metal film 6 is the same as that of the thin metal film 4, excellent adhesion between metal films 4 and 6 can be achieved, as a matter of course. Note that, when the material of the thick metal film 6 is different from that of the thin metal film 4, and the film 6 cannot be etched by an etching solution for the thin metal film 4, the thick metal film 6 need not be formed to have large thickness in advance.

Figure 1F:
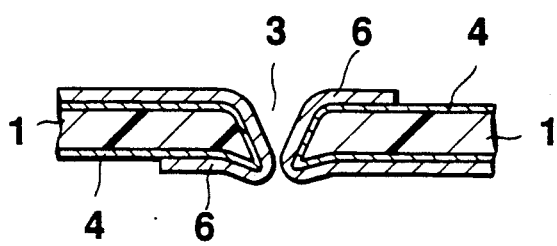
Figure 1G:
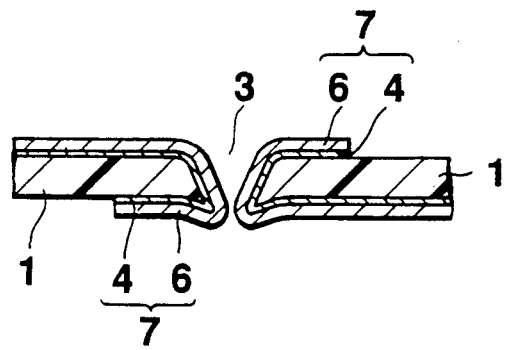
Figure 2F:
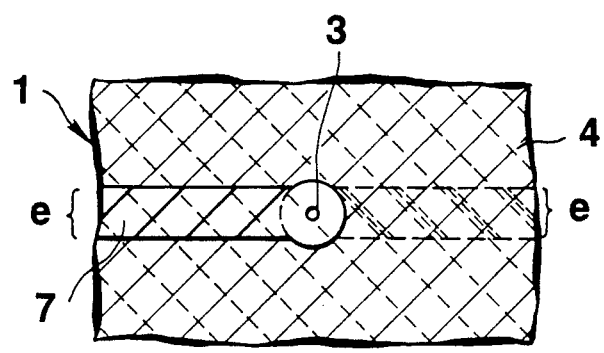
Figure 2G:
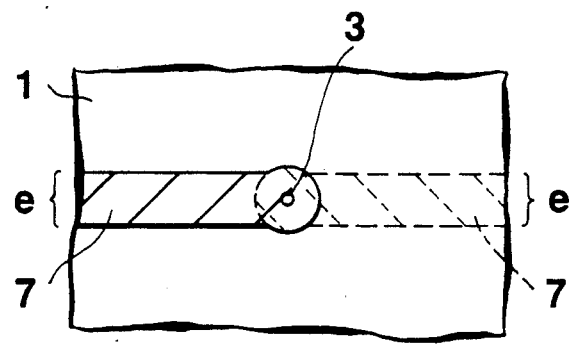

Thereafter, as shown in FIGS. 1F and 2F, the substrate is heated to melt or dipped in an etching solution to remove the insulating layer 5. Then, as shown in FIGS. 1G and 2G, the thin and the thick metal films 4 and 6 are subjected to high-speed etching. More specifically, when an etching solution is sprayed to both surfaces of the double-sided wiring substrate shown in FIG. 1F, the thick metal film 6 and region of the thin metal film 4 which is not covered with the thick metal film 6 are etched at the same speed. If the etching is completed within a short period of time required only to etch the thin metal film 4, although a layer of the thick metal film 6 having a thickness corresponding to that of the thin metal film 4 is removed, a surplus layer of the thick metal film 6 layered thicker than the thin metal film 4 is left without being removed. Thus, when high-speed etching is performed, region of the thin metal film 4 except for the film formed on the wiring pattern formation region e exposed to the surface is removed from the surface of the insulating film 1. However, the thick metal film 6 was formed to have a thickness including the thickness of the thin metal film 4 in advance. Therefore, the film 6 finally has a thickness of about several to several tens $\mu$m, as described above. As a result, a two-layered wiring patterns 7 consisting of the thick and the thin metal films 6 and 4 is formed.

In the above-mentioned high-speed etching, if the material of the thick metal film 6 is different from that of the thin metal film 4 and the film 6 is not removed by an etching solution for the thin metal film 4, this etching is the same as normal etching. In this case, it is required to present a side etching to be occurred at portions of the thin metal film 4 under edge portions of the thick metal film 6. Thus, portions of the wiring patterns 7 corresponding to the upper and lower surfaces of the insulating film 1 are electrically connected to each other through the pin hole 3.

Figure 1H:
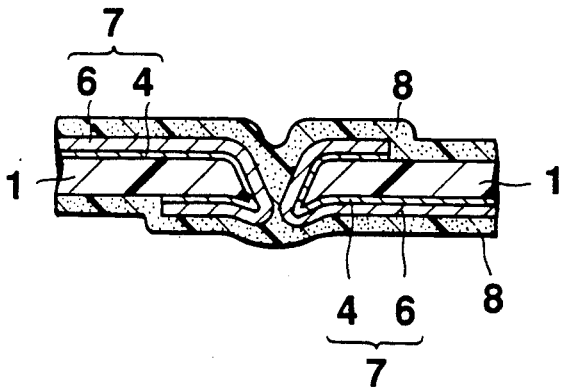
Figure 2H:
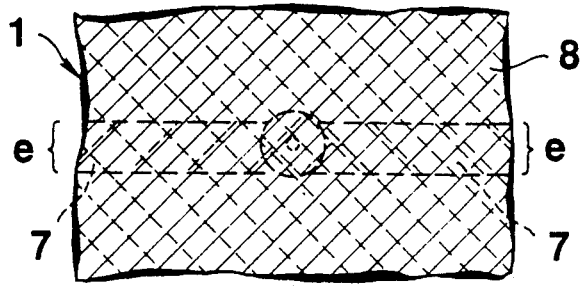

As shown in FIGS. 1H and 2H, an insulating film 8 is applied and formed on the entire upper and lower surfaces of the insulating film 1 to cover the wiring patterns 7, and the wiring patterns 7 and the thick and the thin metal films 6 and 4 in the pin hole 3 are protected from corrosion. Therefore, a double-sided wiring substrate wherein the wiring patterns 7 formed on the upper and lower surfaces of the insulating film 1 are electrically connected to each other through the pin hole 3 can be obtained.

In the above-mentioned method of manufacturing a double-sided wiring substrate, the resistivities of the thin metal film 4 and the thick metal film 6 are low, and these layers can be efficiently formed. In addition, the thick metal film 6 is formed on only the pattern formation region e, and the thin metal film 4 is etched using the thick metal film 6 as a mask. Therefore, a waste of a plating material can be decreased. Since the insulating layer 5 can be formed by a photolithography, extremely fine wiring patterns can be effectively realized.

Note that although the wiring patterns 7 formed on the upper and lower surfaces of the insulating film 1 are connected through the pin hole 3 formed by the pin 2 in the first embodiment, the pin hole 3 can be replaced by a through hole formed by punching or drilling. In addition, utilizing a side surface of the insulating film 1, the wiring patterns formed on the upper and lower surfaces can be connected to each other. Such an embodiment will be described hereinafter.

Second Embodiment

FIGS. 3A to 3E, and FIGS. 4A to 4F show the second embodiment of the present invention.

Figure 3A:
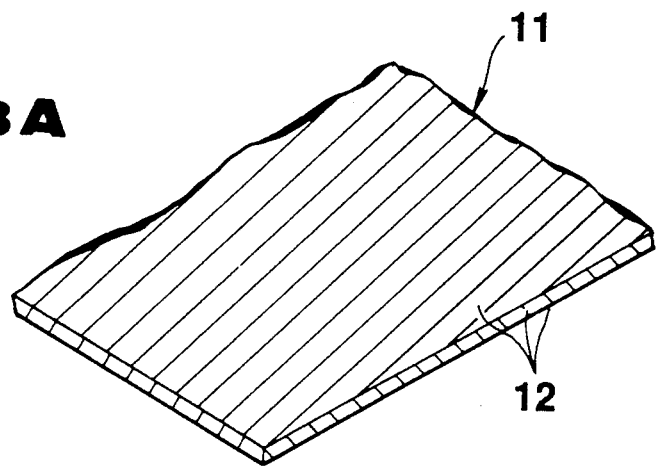
FIGS. 3A, 3B, 3C, 3D, 3E, 3F are perspective views showing an outer appearance of a main part of a wiring substrate in each manufacturing step, and show the second embodiment of the present invention.
Figure 4A:
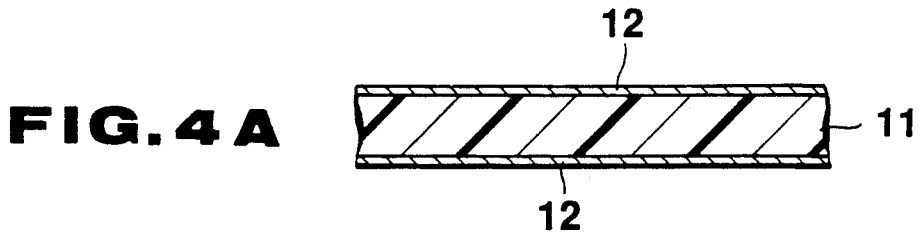
FIGS. 4A, 4B, 4C, 4D, 4E are enlarged views of the main part respectively corresponding to FIGS. 3A, 3B, 3C, 3D, 3E.

As shown in FIGS. 3A and 4A, an insulating substrate 11 is prepared. A thin metal film 12 is formed on the entire surface, i.e., the upper, lower, and side surfaces of the insulating substrate 11 by vaccum deposition or sputtering. The materials of the insulating substrate 1 and the thin metal film 12 are the same as those in the first embodiment.

Figure 3B:
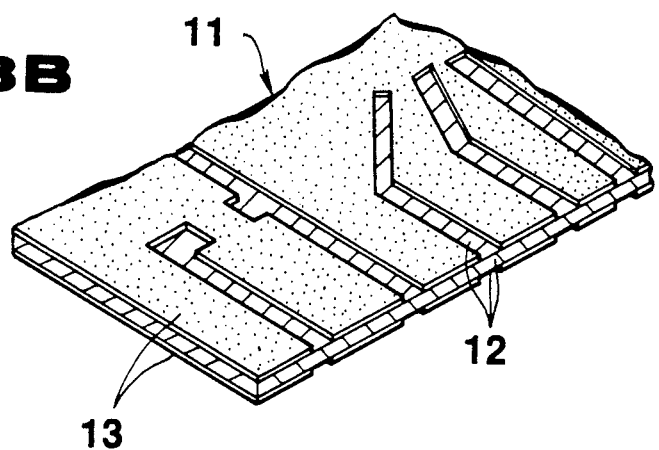
Figure 4B:
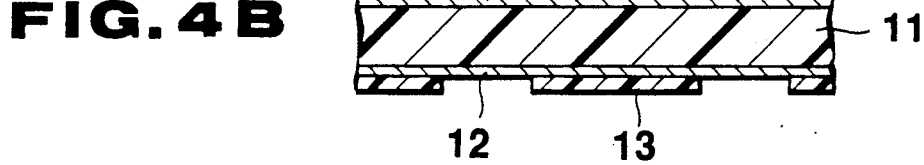

In the next step, as shown in FIGS. 3B and 4B, a resist layer 13 is formed on the thin metal film 12 formed on the upper and lower surfaces of the insulating substrate 11. The resist layer 13 is formed on the entire outer region of wiring patterns, and is patterned by a screen printing or a photolithography.

Figure 3C:
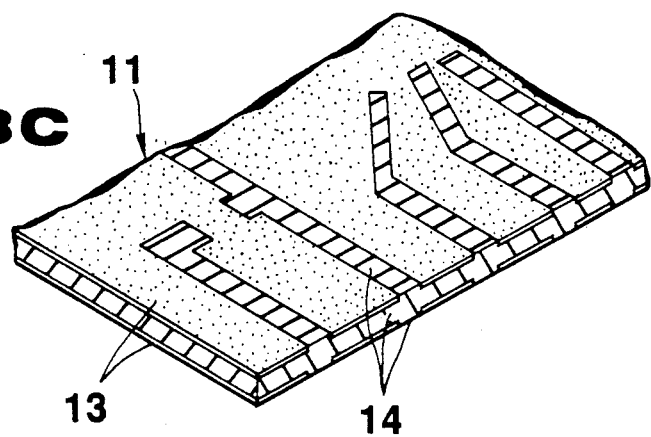
Figure 4C:
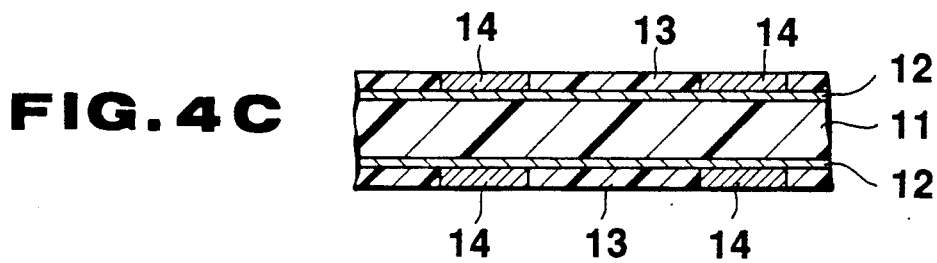

Thereafter, as shown in FIGS. 3C and 4C, a thick metal film 14 is formed on all the region of the thin metal film 12 on which the resist layer 13 is not formed, i.e., on the wiring pattern formation region and the side surface by electroplating. The thick metal film 14 can be easily formed on only the surface of the thin metal film 12 by electroplating since the thin metal film 12 serves as an undercoating electroplating layer without being formed on the surface of the resit layer 13.

Figure 3D:
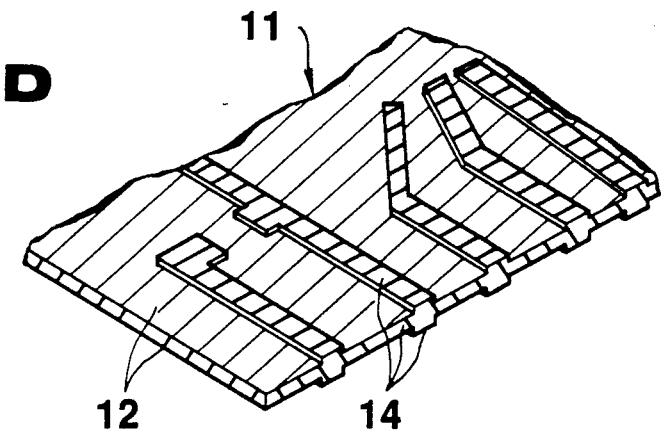
Figure 3E:
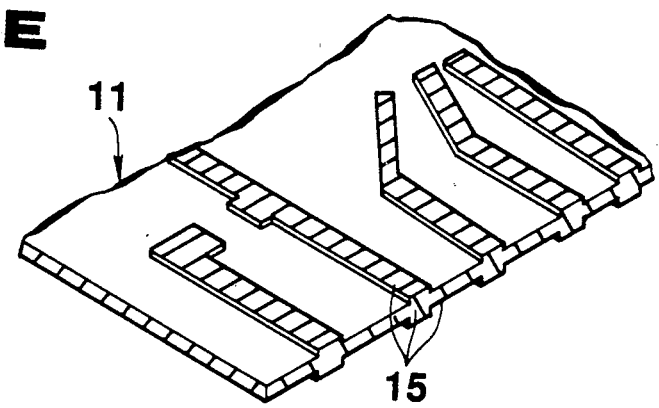
Figure 4D:
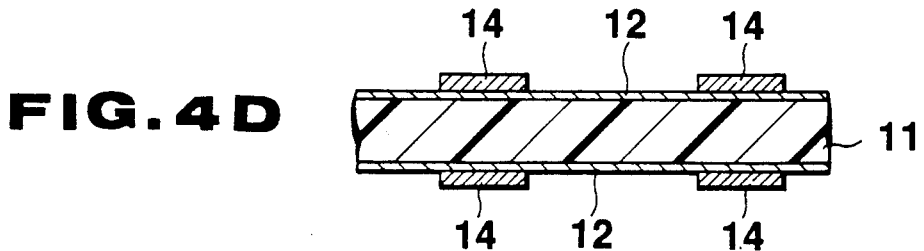
Figure 4E:
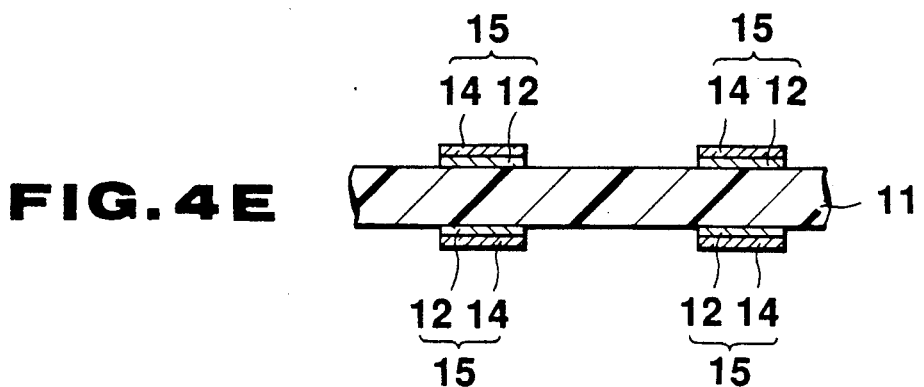

Subsequently, as shown in FIGS. 3D and 4D, the resist layer 13 is removed. In this case, the substrate is heated to melt or is subjected to etching to remove the resist layer 13. Thereafter, as shown in FIGS. 3E and 4E the thin metal film 12 is subjected to high-speed etching using the thick metal film 14 as a mask. This high-speed etching is the same as that described in the first embodiment. Etching is performed for a short period of time to simultaneously remove the thin metal film 12 except for the pattern formation region and the surface layer of the thick metal film 14.

Therefore, a two-layered wiring patterns 15 consisting of the thin and the thick metal films 12 and 14 is formed on the upper and lower surfaces of the insulating substrate 11. In this wiring patterns 15, since the thin and the thick metal films 12 and 14 are formed on the side surface of the insulating substrate 11, the entire upper and lower surfaces of the insulating substrate 11 are electrically connected to each other.

Figure 3F:
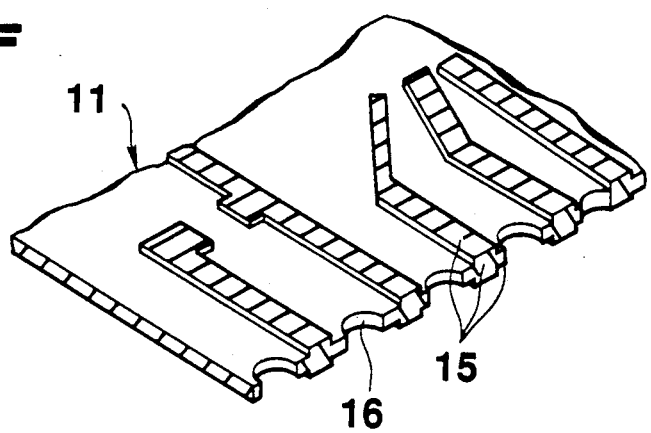

As shown in FIG. 3F, a side edge portion of the insulating substrate 11 is partially notched to form notches 16. When the notches 16 are formed, portions of the thin and the thick metal films 12 and 14 formed on the side edge portions of the notches 16 are removed. Therefore, each conductive line of the wiring patterns 15 is separated from adjacent conductive lines.

As a result, a double-sided wiring substrate wherein the wiring patterns 15 formed on the upper and lower surfaces of the insulating substrate 11 are electrically connected through only predetermined portions of the side edge portion of the insulating substrate 11 can be obtained.

Figure 5A:
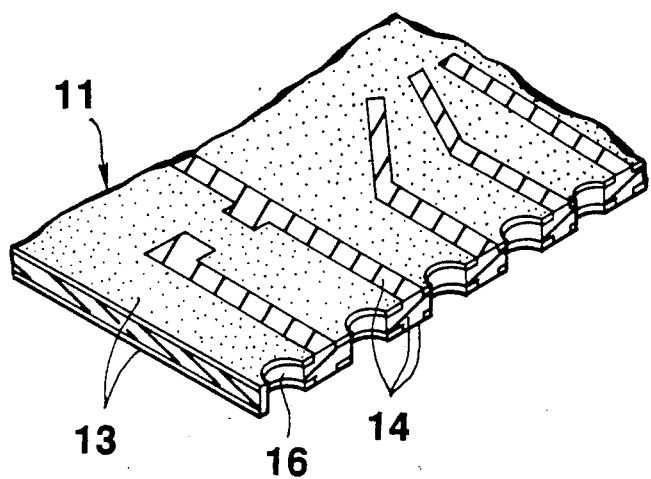
FIGS. 5A and 5B are perspective views of an outer appearance of a wiring substrate in each step to show another method of manufacturing a double-sided wiring substrate which is different from the method in FIGS. 3A to 3F except for the steps in FIGS. 3A to 3C.
Figure 5B:
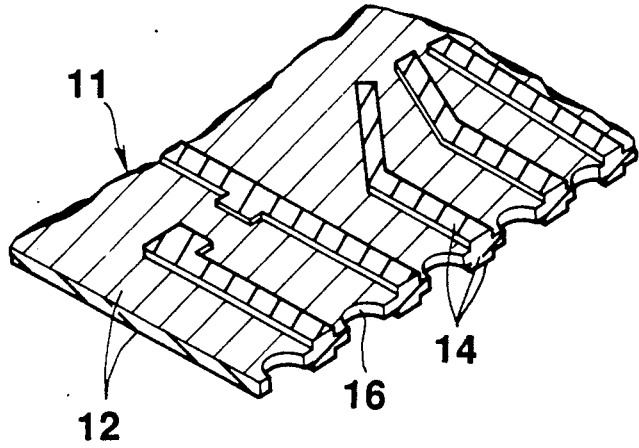

In the above embodiments, after the thin metal film 12 is etched to remove unnecessary portions, the side edge portion of the insulating substrate 11 is finally notched to form the notches 16, thereby removing the thin and the thick metal films 12 and 14 formed on the side surface. However, the present invention is not limited thereto, and the side edge portion of the insulating substrate 11 can be notched any time if it is after the thick metal film 14 is formed on the surface of the thin metal film 12. For example, as shown in FIG. 5A, the resist layer 13 is formed on a region of the thin metal film 12 except for the wiring pattern formation region, and the thick metal film 14 is formed on the wiring pattern formation region of the thin metal film 12 on which the resist layer 13 is not formed, and the side surface of the substrate 11. Thereafter, the side edge portion of the insulating substrate 11 is partially notched to form the notches 16, and the thin and the thick metal films 12 and 14 formed on the side surface of the substrate 11 are removed. Then, as shown in FIG. 5B, the resist layer 13 is removed, and the thin metal film 12 is etched using the thick metal film 14 as a mask. Therefore, a double-sided wiring substrate which is the same as in the above-mentioned embodiments can be obtained.

Figure 6:
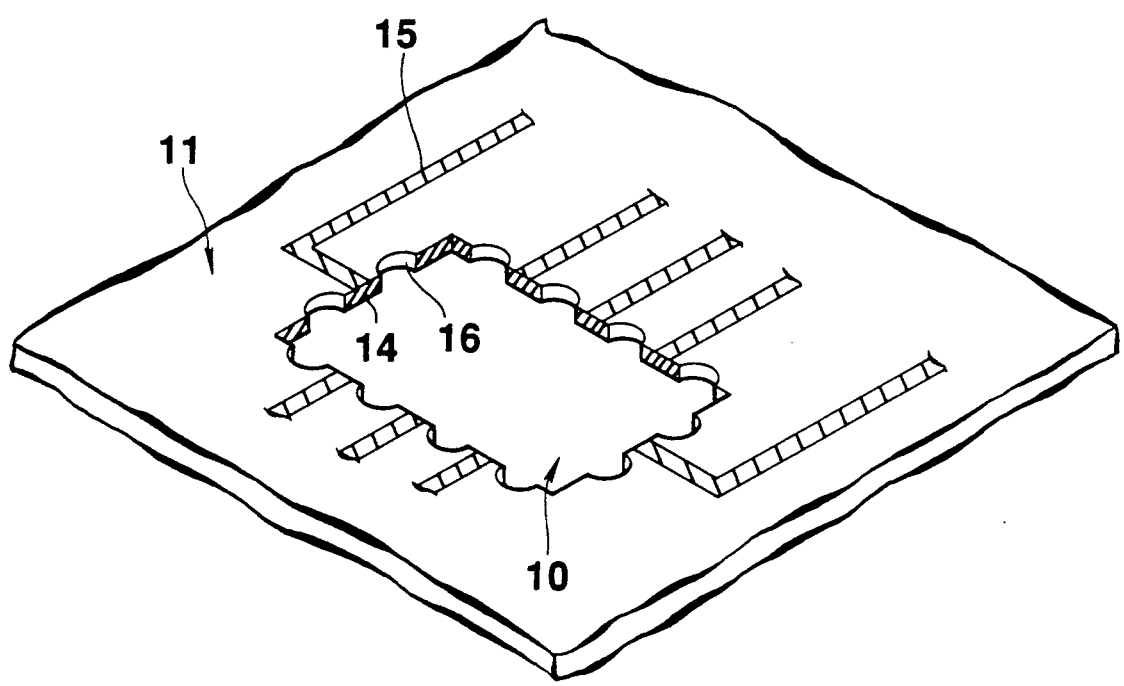
FIG. 6 is a perspective view showing an outer appearance of a double-sided wiring substrate of another type obtained by the manufacturing method shown in the second embodiment.

Although the upper and lower wiring patterns 15 are connected to each other through the side edge portion of the insulating substrate 11 in the above embodiments, the present invention is not limited thereto, and, e.g, a through hole or a notch may be formed in the insulating substrate 11 to connect the upper and lower wiring patterns 15 through the inner side surface of the hole or notch. For example, as shown in FIG. 6, a square through hole 10 is formed at a predetermined portion of the insulating substrate 11 to extend from the upper surface to the lower surface in advance. Thereafter, in the same manner as in the above embodiments, the wiring patterns 15 consisting of the thin and the thick metal films 12 and 14 is formed on the upper and lower surfaces of the insulating substrate 11, and the thin and the thick metal films 12 and 14 are formed on the inner side surface of the through hole 10. Then, the inner side surface of the insulating substrate 11 is partially notched to form the notches 16, and unnecessary portions of the thin and the thick metal films 12 and 14 are removed together with the inner side surface corresponding to the notches 16. As a result, a double-sided wiring substrate, which is similar to those in the above embodiments, and in which the wiring patterns 15 formed on the upper and lower surfaces of the insulating substrate 11 are electrically connected to each other by the thin and the thick metal films 12 and 14 formed on the inner side surface of the through hole 10 formed in the insulating substrate 11, can be obtained. In this case, as shown in FIG. 3A, the thin metal film may often be deposited on the outer side surface of the insulating substrate 11. In the step of forming the thin metal film by vaccum deposition or sputtering, however, the insulating substrate normally has a size which is several times that of a final product, and the substrate is cut into a predetermined size after plating is completed. Therefore, it is considered that a unit insulating substrate does not have an outer side surface. The method of the present invention can be applied to a case wherein the insulating substrate 11 has a size which is substantially equal to that of the final product prior to forming the thin metal film, as a matter of course. In this case, however, a cutting space must be assured in the outer side surface in order to cut the thin and the thick metal films formed on the outer side surface. When the outer side surface is also used to connect the wiring patterns formed on the upper and lower surfaces together with the inner side surface of the through hole or the notches, such a space is not required.

In addition, the present invention is not limited to the above embodiments, and various changes and modifications can be made. For example, the insulating substrate 1 or 11 may be surface-treated, or a proper coating material may be applied on the substrate. A plurality of laminated insulating substrates can be used. Etching for the thin metal film 4 or 12 and the thick metal film 6 or 14 is not limited to wet etching using an etching solution, and dry etching may be performed. If, e.g., solder or gold (Au) is used as a metal material for the thick metal film 6 or 14, the film 6 or 14 does not easily corrode. Therefore, the surface of the wiring patterns 7 or 15 need not be coverted with an insulating protective film. The thin metal film 4 or 12 need not always have a one-layered structure, and a multi-layered structure may be achieved. In addition, the double-sided wiring substrate need not be used as only a circuit substrate, but can be used as a connector for connecting circuit substrates to each other, for connecting a circuit substrate to an electric part, or for connecting electric parts to each other.

What is claimed is:

1. A method of manufacturing a double-sided wiring substrate comprising the steps of:

preparing an insulating substrate having upper and lower surfaces;

piercing said insulating substrate with a pin having a sharp edge to form a hole extending from said upper surface to said lower surface;

forming a thin metal film on said upper and lower surfaces and on the inner surface of said hole of said insulating substrate by vapor deposition;

covering a region of said upper and lower surfaces of said insulating substrate, except for a wiring pattern formation region, with a resist layer;

forming a thick metal film on said thin metal film formed in said wiring pattern formation region on said upper and lower surfaces and on said inner surface of said hole of said insulating substrate by plating;

removing said resist layer; and removing said thin metal film formed on the region except for said wiring pattern formation region using said thick metal film as a mask.

2. The method according to claim 1, wherein said vapor deposition comprises sputtering.

3. The method according to claim 2, wherein said hole formed in said insulating substrate has a diameter of less than 0.4 mm.

4. The method according to claim 1, wherein said hole formed in said insulating substrate has a diameter of less than 0.4 mm.

5. The method according to claim 2, wherein said insulating substrate is formed of polyester.

6. The method according to claim 1, wherein said insulating substrate is formed of polyester.

7. A method according to claim 1, wherein the step of removing said thin metal film comprises the step of removing a surface layer of said thick metal film at the same time as when said thin metal film is removed.

8. A method of manufacturing a double-sided wiring substrate comprising the steps of:

preparing an insulating substrate having upper, lower, and side surfaces;

forming a thin metal film on said upper, lower, and side surfaces of said insulating substrate by vapor deposition;

covering a region of said upper and lower surfaces of said insulating substrate, except for a wiring pattern formation region of said upper and lower surfaces and an entire portion of said side surfaces, with a resist layer;

forming a thick metal film on said thin metal film formed in said wiring pattern formation region on said side, upper, and lower surfaces of said insulating substrate by plating;

said thick metal film on said upper and lower surfaces including a plurality of lines reaching said side surface;

removing said resist layer;

removing said thin metal film formed on the region except for said wiring pattern formation region using said thick metal film as a mask; and notching said side surface of said insulating substrate between said lines to remove said thin and thick metal films which are present between said lines together with said side surface.

9. The method according to claim 8, wherein said vapor deposition comprises sputtering.

10. The method according to claim 9, wherein said insulating substrate is formed of polyester.

11. The method according to claim 8, wherein said insulating substrate is formed of polyester.

12. The method according to claim 8, wherein the step of removing said thin metal film comprises the step of removing a surface layer of said thick metal film at the same time as when said thin metal film is removed.

13. A method of manufacturing a double-sided wiring substrate comprising the steps of:

preparing an insulating substrate having upper and lower surfaces;

forming an opening having an inside surface in said insulating substrates;

forming a thin metal film on said upper, lower, and inner side surfaces of said opening of said insulating substrate by vapor deposition;

covering a region of said upper and lower surfaces of said insulating substrate, except for a wiring pattern formation region of said upper and lower surfaces and an entire portion of said inside surface of said opening, with a resist layer;

forming a thick metal film on said thin metal film formed in said wiring pattern formation region on said side, upper, and lower surfaces of said insulating substrate by plating;

said thick metal film on said upper and lower surfaces including a plurality of lines reaching said inside surface;

removing said resist layer;

removing said thin metal film formed on the region except for said wiring pattern formation region using said thick metal film as a mask; and notching said inside surface of said insulating substrate between said lines to remove said thin and thick metal films which are present between said lines together with said inside surface of said opening.

14. The method according to claim 13, wherein said vapor deposition comprises sputtering.

15. The method according to claim 14, wherein said insulating substrate is formed of polyester.

16. The method according to claim 13, wherein said insulating substrate is formed of polyester.

17. The method according to claim 13, wherein the step of removing said thin metal film comprises the step of removing a surface layer of said thick metal film at the same time as when said thin metal film is removed.

* * * * *